(12) United States Patent
Arya et al.

(10) Patent No.: US 10,101,162 B2
(45) Date of Patent: Oct. 16, 2018

(54) CARTOGRAPHIC DATA USING UTILITY DATA

(71) Applicant: International Business Machines Corporation, Armonk, NY (US)

(72) Inventors: Vijay Arya, Bangalore (IN); Sambaran Bandyopadhyay, Chinsurah (IN); Ramachandra Kota, Hyderabad (IN); Rajendu Mitra, Sambhal (IN)

(73) Assignee: International Business Machines Corporation, Armonk, NY (US)

( * ) Notice: Subject to any disclaimer, the term of this patent is extended or adjusted under 35 U.S.C. 154(b) by 209 days.

(21) Appl. No.: 14/991,689

(22) Filed: Jan. 8, 2016

(65) Prior Publication Data

US 2017/0199042 A1    Jul. 13, 2017

(51) Int. Cl.
| | | |
|---|---|---|
| *G01V 3/38* | (2006.01) | |
| *G01C 21/32* | (2006.01) | |
| *G01R 22/06* | (2006.01) | |

(52) U.S. Cl.
CPC ......... *G01C 21/32* (2013.01); *G01R 22/063* (2013.01)

(58) Field of Classification Search
None
See application file for complete search history.

(56) References Cited

U.S. PATENT DOCUMENTS

| | | | |
|---|---|---|---|
| 6,453,233 | B1 | 9/2002 | Kato |
| 7,834,806 | B2 | 11/2010 | Tucker et al. |
| 8,775,083 | B2 | 7/2014 | Young et al. |
| 2008/0180322 | A1 | 7/2008 | Islam et al. |
| 2010/0207751 | A1 | 8/2010 | Follmer et al. |
| 2013/0099976 | A1* | 4/2013 | Cornwall ............. G01S 5/0257 342/450 |

\* cited by examiner

*Primary Examiner* — Cory Eskridge
(74) *Attorney, Agent, or Firm* — Ference & Associates LLC

(57) ABSTRACT

One embodiment provides a method for improving cartographic data using utility data, the method including: obtaining cartographic information; obtaining geo-location information associated with at least one utility asset; utilizing at least one processor to execute computer code that performs the steps of: generating, based on the geo-location information, a cartographic representation of the at least one utility asset; and modifying, based on the cartographic representation, the cartographic information. Other aspects are described and claimed.

20 Claims, 3 Drawing Sheets

CARTOGRAPHIC DATA USING UTILITY DATA

BACKGROUND

Various maps, including online or electronic maps of rural or urban areas may often be incomplete or inaccurate. This inaccuracy or incompleteness may be due to various factors (e.g., tree growth that may hinder identification of satellite imagery, erroneous labeling of buildings or streets, outdated map information, etc.). Although these issues can arise anywhere in the world, they are more prevalent in developing countries that have incomplete information regarding public infrastructure, particularly rural infrastructure.

BRIEF SUMMARY

In summary, one aspect of the invention provides a method for improving cartographic data using utility data, the method comprising: obtaining cartographic information; obtaining geo-location information associated with at least one utility asset; utilizing at least one processor to execute computer code that performs the steps of: generating, based on the geo-location information, a cartographic representation of the at least one utility asset; and modifying, based on the cartographic representation, the cartographic information.

Another aspect of the invention provides an apparatus for improving cartographic data using utility data, the apparatus comprising: at least one processor; and a computer readable storage medium having computer readable program code embodied therewith and executable by the at least one processor, the computer readable program code comprising: computer readable program code that obtains cartographic information; computer readable program code that obtains geo-location information associated with at least one utility asset; computer readable program code that generates, based on the geo-location information, a cartographic representation of the at least one utility asset; and computer readable program code that modifies, based on the cartographic representation, the cartographic information.

An additional aspect of the invention provides a computer program product for improving cartographic data using utility data, the computer program product comprising: a computer readable storage medium having computer readable program code embodied therewith, the computer readable program code comprising: computer readable program code that obtains cartographic information; computer readable program code that obtains geo-location information associated with at least one utility asset; computer readable program code that generates, based on the geo-location information, a cartographic representation of the at least one utility asset; and computer readable program code that modifies, based on the cartographic representation, the cartographic information.

A further aspect of the invention provides a method for improving cartographic data using utility data, the method comprising: utilizing at least one processor to execute computer code that performs the steps of: obtaining, using a processor, cartographic information; obtaining geo-location information associated with at least one utility asset; obtaining at least one characteristic associated with the at least one utility asset; generating, based on the geo-location information and at least one characteristic, a cartographic representation of the at least one utility asset; and modifying, based on the cartographic representation, the cartographic information.

For a better understanding of exemplary embodiments of the invention, together with other and further features and advantages thereof, reference is made to the following description, taken in conjunction with the accompanying drawings, and the scope of the claimed embodiments of the invention will be pointed out in the appended claims.

DETAILED DESCRIPTION

Figure 1:
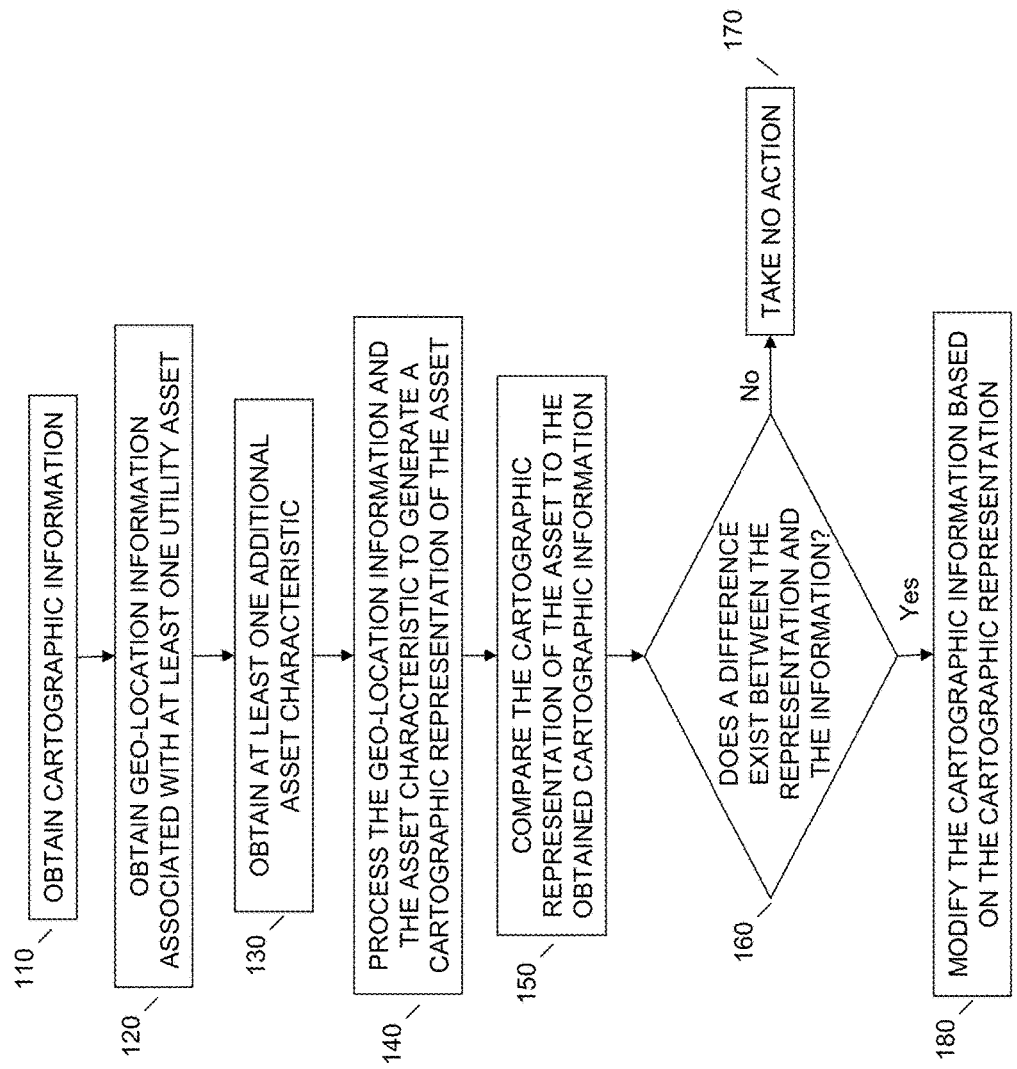
FIG. 1 schematically illustrates a method for improving cartographic data using utility data.

It will be readily understood that the components of the embodiments of the invention, as generally described and illustrated in the figures herein, may be arranged and designed in a wide variety of different configurations in addition to the described exemplary embodiments. Thus, the following more detailed description of the embodiments of the invention, as represented in the figures, is not intended to limit the scope of the embodiments of the invention, as claimed, but is merely representative of exemplary embodiments of the invention.

Reference throughout this specification to "one embodiment" or "an embodiment" (or the like) means that a particular feature, structure, or characteristic described in connection with the embodiment is included in at least one embodiment of the invention. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in at least one embodiment. In the following description, numerous specific details are provided to give a thorough understanding of embodiments of the invention. One skilled in the relevant art may well recognize, however, that embodiments of the invention can be practiced without at least one of the specific details thereof, or can be practiced with other methods, components, materials, et cetera. In other instances, well-known structures, materials, or operations are not shown or described in detail to avoid obscuring aspects of the invention.

The illustrated embodiments of the invention will be best understood by reference to the figures. The following description is intended only by way of example and simply illustrates certain selected exemplary embodiments of the invention as claimed herein. It should be noted that the flowchart and block diagrams in the figures illustrate the architecture, functionality, and operation of possible implementations of systems, apparatuses, methods and computer program products according to various embodiments of the invention. In this regard, each block in the flowchart or block diagrams may represent a module, segment, or portion of code, which comprises at least one executable instruction for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Specific reference will be made here below to the figures. It should be appreciated that the processes, arrangements and products broadly illustrated therein can be carried out on, or in accordance with, essentially any suitable computer system or set of computer systems, which may, by way of an illustrative and non-restrictive example, include a system or server such as that indicated at 12' in FIG. 3. In accordance with an example embodiment, most if not all of the process steps, components and outputs discussed with respect to FIGS. 1-2 can be performed or utilized by way of a processing unit or units and system memory such as those indicated, respectively, at 16' and 28' in FIG. 3, whether on a server computer, a client computer, a node computer in a distributed network, or any combination thereof.

As stated herein, maps or cartographic information, in both electronic and paper form, can be incomplete or contains errors. This can happen for a variety of reasons, for example errors during information collection or failing to keep up with any changes in existing infrastructure. Due to the extremely large amount of information required to create a map and maintain its accuracy, most existing versions of maps likely contain errors. Thus, any system that can use existing data to ease the burden of creation, or improve the accuracy and maintenance of existing maps would be a clear technological improvement in the art.

Various commercial and governmental providers exist that provide maps for navigation systems, geographic information systems, and other services. Typically, these services acquire data through several methods. Moreover, these services may continuously update the existing map information using, for example, satellite imagery, crowd-sourced information, physical ground mapping, and so on. However, these current methods are insufficient and the result is a significant number of regions left unmapped or erroneously mapped, specifically rural areas in developing countries.

One untapped source of location based information are the data collected and retained by utility companies (e.g., electrical providers, natural gas providers, water and sewage providers, etc.). Utilities generally exist in all geographic regions regardless of population density. Moreover, the utilities often have access to very detailed information gathered from the ground that most map providers do not collect. For example, utility companies typically record and store geospatial data related to their assets and customers. One example of this data collection is the use of smart meters. Smart meters allow a utility to locate an individual meter's geospatial location (e.g., the latitude and longitude coordinates), using, for example, a global navigation system (e.g., GPS, GLONASS, DORIS, etc.). This geospatial information can be monetized to act as an additional revenue source by processing it and using it to provide map improvement services to commercial map providers.

In one embodiment, after the geospatial location is determined (e.g., using GPS), it may be associated with a customer's address. Utilities may also maintain additional data associated with their customers and customer installations, such as information regarding the nature of an establishment for pricing purposes (e.g., residential, commercial, etc.). Additionally, many utilities record the geospatial location of their assets (e.g., transformers, power/telephone poles, distribution lines, meters, etc.).

Generally, when processing information from utility maps it can be observed that, usually, laterals (i.e., distribution lines) lie along the edges of streets, transformers lie adjacent to streets, and customer meters lie at streets or in close proximity to structures with street access. Based on the combination of geospatial location of the laterals, transformers, and customer meters, the approximate location of many streets can be inferred. Moreover, an embodiment may use the address data of customers, in combination with additional data (e.g., type of customer) to make further assumptions, such as zoning and street layout or design.

Therefore, an embodiment may address the shortcomings of conventional maps by obtaining and processing the information collected by utilities. For example, an embodiment may obtain some cartographic information, such as online map data (e.g., Google maps, Bing maps, etc.). GOOGLE is a registered trademark of Google, Inc. in the United States and other countries. BING is a registered trademark of Microsoft Corporation in the United States and other countries. An embodiment may then also obtain geo-location information for at least one utility asset (e.g., meter, transformer, pole, line, pipe, etc.). Once geo-location information is acquired, it is processed to generate a cartographic representation of the utility assets with respect to one another and their geospatial location. Based on the created cartographical representation, the originally acquired cartographic information (e.g., map data) may be modified for improved accuracy.

Referring now to FIG. 1, an embodiment may obtain cartographic information at 110. Generally, the cartographic information comprises existing map data. These map data may be generated or acquired from a third party map maker or application. As discussed herein, this obtained cartographic information may contain errors or omissions of information. These errors or omissions may be caused by inaccurate information collection or improper maintenance of existing map records. For example, some section of roadway infrastructure may have been changed (e.g., an exit ramp is re-numbered or configured in a different manner) since the last information update.

An embodiment may also receive geo-location information associated with at least one utility asset at 120. The utility asset(s) may consist of a variety of items related to various utility types, such as, for example, customer meters (e.g., electric, gas, water, etc.), electrical transformers, electrical distribution lines, telephone poles, underground pipelines (e.g., gas pipe, water pipe, sewage pipe, etc.). Typically, these utility assets will be located along streets or roads. Additionally, some assets, such as meters, may be attached to customer buildings, which typically have street access. This information is typically recorded by utility companies in order to identify, track, and maintain their assets and customers. This utility geo-location information may be obtained from a variety of sources. For example, the information may be purchased or acquired from an energy utility, individually gathered, or procured from a government entity.

A further embodiment may also obtain at least one additional asset characteristic at 130. For example, some of the assets may have information associated with them, such as customer-level information. This customer-level information may include a large variety of information. One example may be identifying a customer type, such as, residential, commercial, or industrial. A further example may be a customer's building number or home address. In another example, utility usage may be valuable in determining the size of the building, or approximate number of occupants a building might have. Although various examples of customer-level information are discussed herein, it should be understood that any information that is accessible to a utility company may be collected and received.

Once the geo-location and/or characteristic information is obtained at 120, an embodiment may process the geo-location information and the asset characteristic to generate a cartographic representation of the asset at 140. In order to generate a cartographic representation, an embodiment plots the latitude and longitude values of each utility asset (e.g., laterals (transmission lines), transformers, etc.) obtained at 120. In addition to plotting based on geospatial location, an embodiment may tag an asset(s) with any additionally known information, such as a user address. In one embodiment, this tagging may be done for each customer, and the information within the tag may include billing information and the corresponding location of the customer with a specific address including: house number, street name, postcode, state identifier, and the like. Additionally or alternatively, an embodiment may tag each customer address with the type of premise (e.g., residential, commercial, industrial, etc.) and mark the corresponding location and/or zoning codes.

In another embodiment, utility assets are plotted via latitude and longitude similar to above, and then associated via connectivity lines. An embodiment may draw connectivity lines for both above and underground installations (e.g., laterals, transformers, hubs, etc.). These connectivity lines may be useful in identifying potential roads and building locations. In particular, underground installations may likely indicate the edge of a roadway or interchange, whereas, the connectivity lines of overhead installations may be marked as potentially laying within the road itself (e.g., a pole mounted transformer that overhangs the road).

In one embodiment, the connectivity lines may be combined with asset characteristic information, as discussed herein, to extract potential street names from the asset characteristic information. A further embodiment may then mark the corresponding connectivity lines with the extracted street names. In one embodiment, a street name may only be applied if the connectivity lines are determined to be within a predetermined threshold distance from the previously known road location. For example, if the connectivity lines are located within five feet of an assumed road position, an embodiment may determine the name of the corresponding road based on the connecting lines. Additionally, if multiple street names are present (e.g., multiple connecting lines within five feet), an embodiment may determine the mostly likely street name from the group. This determination may be selected based on a street name that occurs most frequently, or street names may be weighted based on their identified proximity to the previously known road location. Thus, if a single connectivity line is located within two feet of the previously identified road path, it may still be selected over two similarly named connectivity lines that are twenty feet away.

Figure 2:
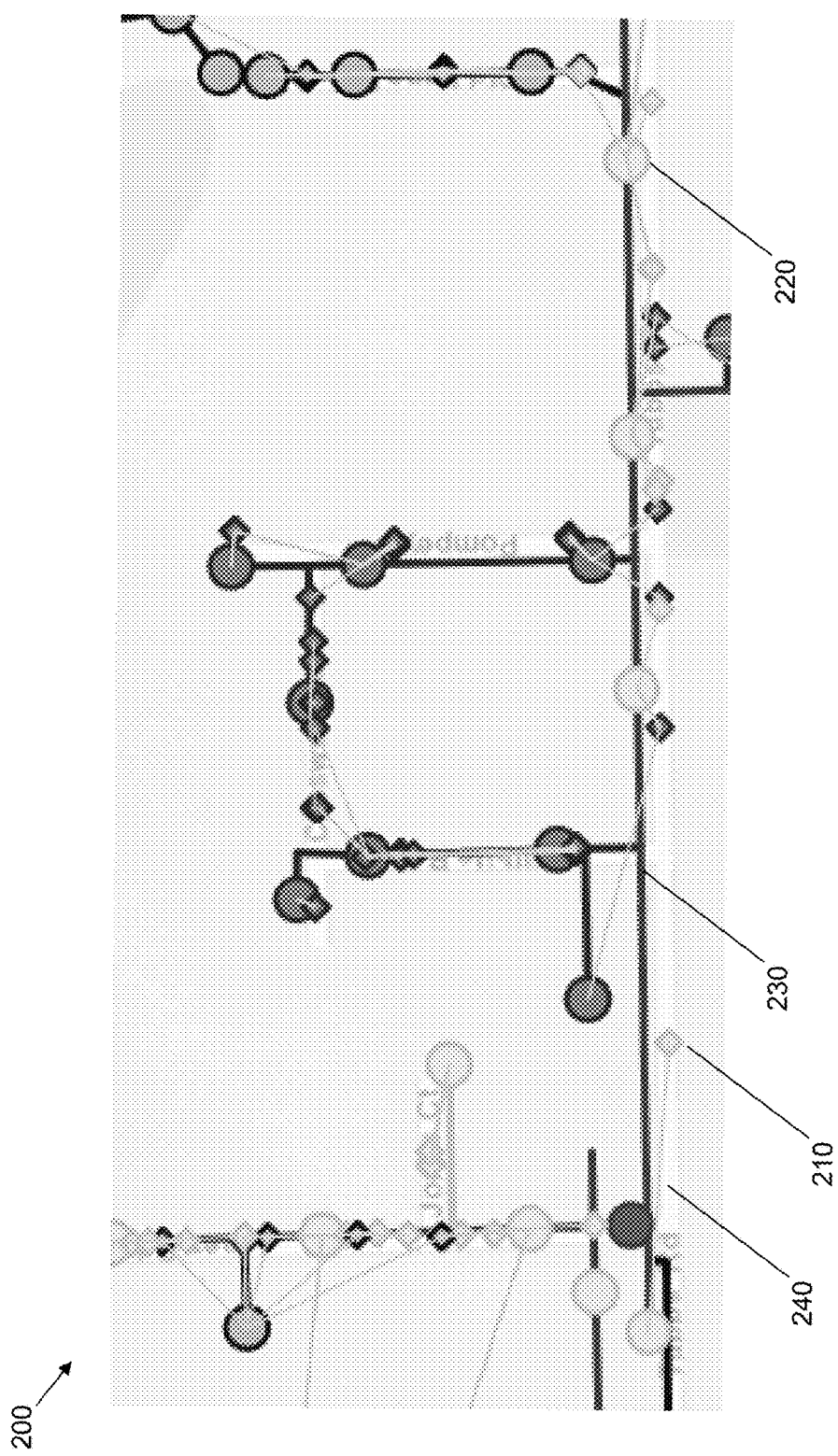
FIG. 2 illustrates an example comparison between known cartographic information and a generated cartographic representation.

Briefly referencing FIG. 2, an example embodiment illustrates a variety of assets being plotted based on their latitude and longitude. For example, the diamond symbol, such as shown at 210 may represent customer meters. These customer meters, as discussed herein, are typically associated with a physical address (e.g., customer address), and thus can help in determining adjacent street names. In a further embodiment, the circles such as that shown at 220, may represent transformers. Generally, a single transformer is capable of supplying multiple meters with power. Thus, as discussed herein, transformers are usually placed near or even above road-ways to allow for easier access to a group (or row) of houses or businesses located near each other.

In addition to specific assets, an embodiment may also show the generated connectivity lines, such as at 230. The connectivity lines may show interconnected assets, and how the connections (e.g., laterals or distribution lines) are run. It may be determined that the connectivity lines run along the edges of the streets, allowing for the inference of a roadway, as discussed herein.

Based on the generation of the cartographic representation at 140, and illustrated in FIG. 2, an embodiment may then, at 150, compare or overlay the cartographic representation created at 140 with the cartographic information obtained at 110. Again briefly referring to FIG. 2, an embodiment may overlay the assets and connectivity lines (e.g., 210, 220, and 230) over an existing map 200. In one embodiment, the existing map may have previously known roads, such as 240. Additionally or alternatively, some areas of the existing map may be blank.

Once the information 110 and representation 140 are compared at 150, an embodiment may determine if a difference exists between the two at 160. If no differences exist, an embodiment may take no action at 170. However, if an embodiment determines at least one discrepancy exists, the cartographic information may be modified based on the cartographic representation. For example, an embodiment may determine that the information is incorrect (e.g., a street name may be wrong or relocated) or missing (e.g., an area of the existing map is blank), and based on this determination modify the stored cartographic information using the information contained within the generated cartographic representation.

Figure 3:
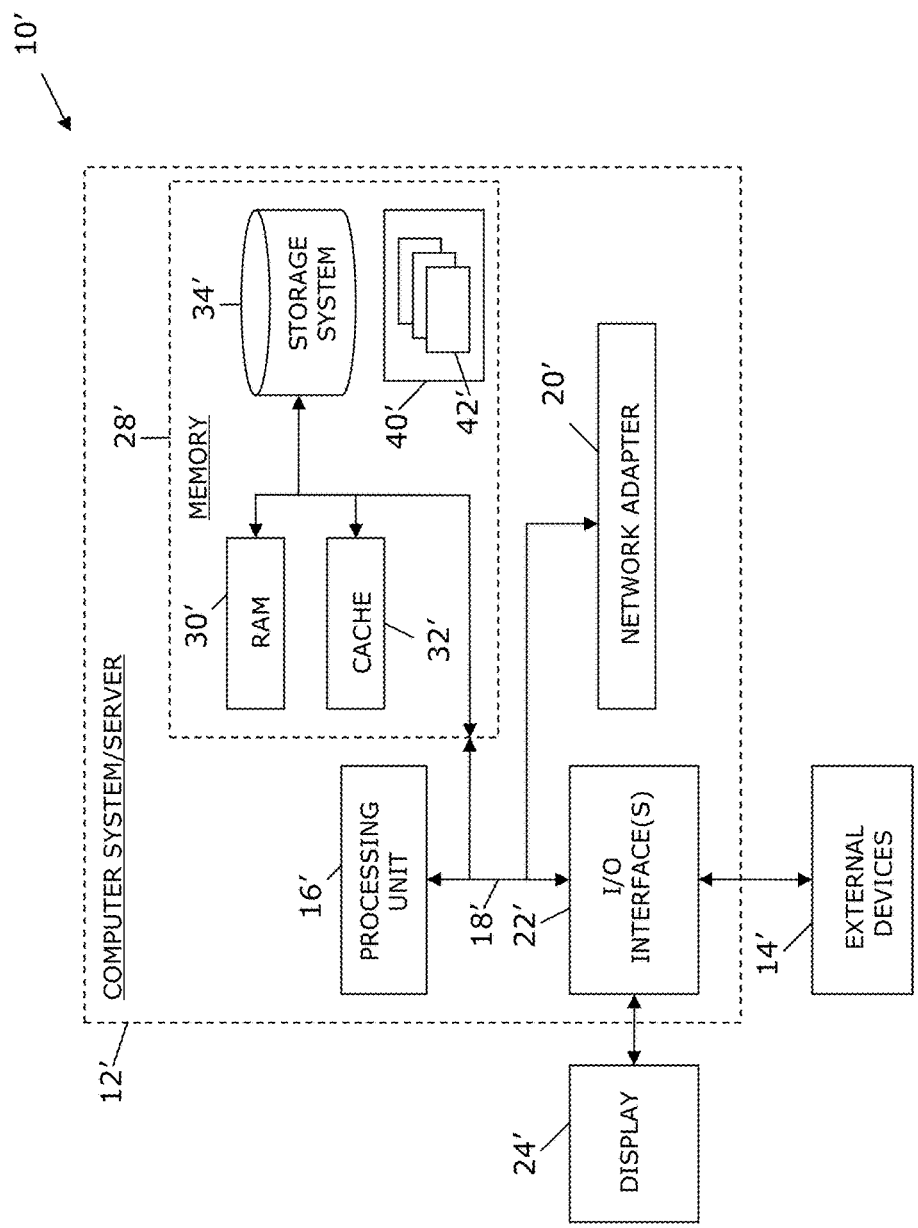
FIG. 3 illustrates an example computer system.

Referring now to FIG. 3, a schematic of an example of a computing node is shown. Computing node 10' is only one example of a suitable computing node and is not intended to suggest any limitation as to the scope of use or functionality of embodiments of the invention described herein. Regardless, computing node 10' is capable of being implemented and/or performing any of the functionality set forth hereinabove. In accordance with embodiments of the invention, computing node 10' may be part of a cloud network or could be part of another type of distributed or other network (e.g., it could represent an enterprise server), or could represent a stand-alone node.

In computing node 10' there is a computer system/server 12', which is operational with numerous other general purpose or special purpose computing system environments or configurations. Examples of well-known computing systems, environments, and/or configurations that may be suitable for use with computer system/server 12' include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12' may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12' may be practiced in distributed cloud computing environments where tasks are performed by remote processing devices that are linked through a communications network. In a distributed cloud computing environment, program modules may be located in both local and remote computer system storage media including memory storage devices.

As shown in FIG. 3, computer system/server 12' in computing node 10' is shown in the form of a general-purpose computing device. The components of computer system/server 12' may include, but are not limited to, at least one processor or processing unit 16', a system memory 28', and a bus 18' that couples various system components including system memory 28' to processor 16'. Bus 18' represents at least one of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12' typically includes a variety of computer system readable media. Such media may be any available media that are accessible by computer system/server 12', and include both volatile and non-volatile media, removable and non-removable media.

System memory 28' can include computer system readable media in the form of volatile memory, such as random access memory (RAM) 30' and/or cache memory 32'. Computer system/server 12' may further include other removable/non-removable, volatile/non-volatile computer system storage media. By way of example only, storage system 34' can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18' by at least one data media interface. As will be further depicted and described below, memory 28' may include at least one program product having a set (e.g., at least one) of program modules that are configured to carry out the functions of embodiments of the invention.

Program/utility 40', having a set (at least one) of program modules 42', may be stored in memory 28' (by way of example, and not limitation), as well as an operating system, at least one application program, other program modules, and program data. Each of the operating systems, at least one application program, other program modules, and program data or some combination thereof, may include an implementation of a networking environment. Program modules 42' generally carry out the functions and/or methodologies of embodiments of the invention as described herein.

Computer system/server 12' may also communicate with at least one external device 14' such as a keyboard, a pointing device, a display 24', etc.; at least one device that enables a user to interact with computer system/server 12'; and/or any devices (e.g., network card, modem, etc.) that enable computer system/server 12' to communicate with at least one other computing device. Such communication can occur via I/O interfaces 22'. Still yet, computer system/server 12' can communicate with at least one network such as a local area network (LAN), a general wide area network (WAN), and/or a public network (e.g., the Internet) via network adapter 20'. As depicted, network adapter 20' communicates with the other components of computer system/server 12' via bus 18'. It should be understood that although not shown, other hardware and/or software components could be used in conjunction with computer system/server 12'. Examples include, but are not limited to: microcode, device drivers, redundant processing units, external disk drive arrays, RAID systems, tape drives, and data archival storage systems, etc.

This disclosure has been presented for purposes of illustration and description but is not intended to be exhaustive or limiting. Many modifications and variations will be apparent to those of ordinary skill in the art. The embodiments were chosen and described in order to explain principles and practical application, and to enable others of ordinary skill in the art to understand the disclosure.

Although illustrative embodiments of the invention have been described herein with reference to the accompanying drawings, it is to be understood that the embodiments of the invention are not limited to those precise embodiments, and that various other changes and modifications may be affected therein by one skilled in the art without departing from the scope or spirit of the disclosure.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method for improving cartographic data using utility data, the method comprising:
   obtaining cartographic information, wherein the cartographic information comprises existing map data;
   obtaining geo-location information associated with a plurality of utility assets, wherein the geo-location information identifies a geospatial location of the each of the plurality of utility assets;
   generating, based on the geo-location information, a cartographic representation of each of the plurality of utility assets with respect to the other utility assets and the geospatial location of each of the plurality of utility assets, wherein the generating comprises plotting latitude values and longitude values of each of the utility assets and associating each of the utility assets via generation of connectivity lines corresponding to utility installations;
   comparing the generated cartographic representation with the obtained cartographic information; and
   modifying, based on differences identified from the comparing, the cartographic information.

2. The method of claim 1, wherein the at least one utility asset comprises a utility meter.

3. The method of claim 2, wherein the utility meter is associated with a known address.

4. The method of claim 3, wherein said modifying comprises modifying, based on the known address, the cartographic information.

5. The method according to claim 1, comprising:
   identifying one or more street locations based on the cartographic representation;
   wherein said modifying comprises modifying, based on the identified street location, the cartographic information.

6. The method according to claim 1, comprising:
   identifying one or more street dimensions based on the cartographic representation;
   wherein said modifying comprises modifying, based on the identified street dimension, the cartographic information.

7. The method according to claim 1, wherein said modifying comprises identifying, based on the cartographic representation, missing information in the cartographic information.

8. The method according to claim 1, wherein said modifying comprises identifying, based on the cartographic representation, one or more errors in the cartographic information.

9. The method according to claim 8, wherein the one or more errors comprise at least one of: one or more incorrect street names, one or more incorrect street dimensions, one or more incorrect locations, one or more incorrect classifications of locations, and one or more incorrect addresses.

10. An apparatus for improving cartographic data using utility data, the apparatus comprising:
 at least one processor; and
 a non-transitory computer readable storage medium having computer readable program code embodied therewith and executable by the at least one processor, the computer readable program code comprising:
 computer readable program code that obtains cartographic information, wherein the cartographic information comprises existing map data;
 computer readable program code that obtains geo-location information associated with a plurality of utility assets, wherein the geo-location information identifies a geospatial location of the each of the plurality of utility assets;
 computer readable program code that generates, based on the geo-location information, a cartographic representation of each of the plurality of utility assets with respect to the other utility assets and the geospatial location of each of the plurality of utility assets, wherein the generating comprises plotting latitude values and longitude values of each of the utility assets and associating each of the utility assets via generation of connectivity lines corresponding to utility installations;
 computer readable program code that compares the generated cartographic representation with the obtained cartographic information; and
 computer readable program code that modifies, based on differences identified from the comparing, the cartographic information.

11. A computer program product for improving cartographic data using utility data, the computer program product comprising:
 a non-transitory computer readable storage medium having computer readable program code embodied therewith, the computer readable program code comprising:
 computer readable program code that obtains cartographic information, wherein the cartographic information comprises existing map data;
 computer readable program code that obtains geo-location information associated with a plurality of utility assets, wherein the geo-location information identifies a geospatial location of the each of the plurality of utility assets;
 computer readable program code that generates, based on the geo-location information, a cartographic representation of each of the plurality of utility assets with respect to the other utility assets and the geospatial location of each of the plurality of utility assets, wherein the generating comprises plotting latitude values and longitude values of each of the utility assets and associating each of the utility assets via generation of connectivity lines corresponding to utility installations;
 computer readable program code that compares the generated cartographic representation with the obtained cartographic information; and
 computer readable program code that modifies, based on differences identified from the comparing, the cartographic information.

12. The computer program product of claim 11, wherein the at least one utility asset comprises a utility meter.

13. The computer program product of claim 12, wherein the utility meter is associated with a known address.

14. The computer program product of claim 13, wherein said modifying comprises modifying, based on the known address, the cartographic information.

15. The computer program product according to claim 11, comprising:
 computer readable program code that identifies one or more street locations based the cartographic representation;
 wherein said modifying comprises modifying, based on the identified street location, the cartographic information.

16. The computer program product according to claim 11, comprising:
 computer readable program code that identifies one or more street dimensions based the cartographic representation;
 wherein said modifying comprises modifying, based on the identified street dimension, the cartographic information.

17. The computer program product according to claim 11, wherein said modifying comprises identifying, based on the cartographic representation, missing information in the cartographic information.

18. The computer program product according to claim 11, wherein said modifying comprises identifying, based on the cartographic representation, one or more errors in cartographic information.

19. The computer program product according to claim 18, wherein the one or more errors comprise at least one of: one or more incorrect street names, one or more incorrect street dimensions, one or more incorrect locations, one or more incorrect classifications of locations, and one or more incorrect addresses.

20. A method for improving cartographic data using utility data, the method comprising:
 utilizing at least one processor to execute computer code that performs the steps of:
 obtaining cartographic information, wherein the cartographic information comprises existing map data;
 obtaining geo-location information associated with a plurality of utility assets, wherein the geo-location information identifies a geospatial location of the each of the plurality of utility assets;
 obtaining at least one characteristic associated with at least one of the plurality of utility assets;
 generating, based on the geo-location information and at least one characteristic, a cartographic representation of each of the plurality of utility assets with respect to the other utility assets and the geospatial location of each of the plurality of utility assets, wherein the generating comprises plotting latitude values and longitude values of each of the utility assets, associating each of the utility assets via generation of connectivity lines corresponding to utility installations, and representing the at least one characteristic;
 comparing the generated cartographic representation with the obtained cartographic information; and
 modifying, based on differences identified from the comparing, the cartographic information.

\* \* \* \* \*